United States Patent
Mueller et al.

(10) Patent No.: US 6,823,026 B2
(45) Date of Patent: Nov. 23, 2004

(54) APPARATUS AND METHOD FOR BASEBAND DETECTION

(75) Inventors: Bruce D. Mueller, Palatine, IL (US); Yumin Lee, Taipei (TW)

(73) Assignee: Motorola, Inc., Schaumburg, IL (US)

( * ) Notice: Subject to any disclaimer, the term of this patent is extended or adjusted under 35 U.S.C. 154(b) by 752 days.

(21) Appl. No.: 09/755,833

(22) Filed: Jan. 5, 2001

(65) Prior Publication Data

US 2002/0122509 A1 Sep. 5, 2002

(51) Int. Cl.[7] .................................................. H03D 3/22
(52) U.S. Cl. .................. 375/329; 375/286; 375/216; 375/331; 375/39; 375/231; 375/324; 370/119
(58) Field of Search ..................... 375/329, 326, 375/331, 231, 216, 341; 380/39

(56) References Cited

U.S. PATENT DOCUMENTS

| | | | |
|---|---|---|---|
| 4,499,426 A | 2/1985 | Parker | |
| 4,612,509 A | 9/1986 | Betts et al. | |
| 4,984,219 A | * 1/1991 | Brown et al. | 380/39 |
| 5,377,229 A | 12/1994 | Wilson et al. | |
| 5,420,888 A | 5/1995 | Davis et al. | |
| 5,581,579 A | * 12/1996 | Lin et al. | 375/331 |
| 5,642,379 A | * 6/1997 | Bremer | 375/216 |
| 5,828,705 A | * 10/1998 | Kroeger et al. | 375/326 |
| 6,373,888 B1 | * 4/2002 | Lindoff | 375/231 |

* cited by examiner

Primary Examiner—Shuwang Liu
(74) Attorney, Agent, or Firm—Kenneth A. Haas (57) ABSTRACT

A baseband detector includes a complex differential detector, a constellation point computer, and a phase shift keying (PSK) decoder. The complex differential detector outputs complex values in response to digitized samples derived from a received baseband signal. The PSK decoder generates decoded bits representing information symbols by determining in minimum distance between the complex values and plural constellation points provided by the constellation point computer. The constellation point computer can adaptively generate the constellation points based on a training sequence of information symbols and their corresponding complex valued outputs from the complex differential detector. The baseband detector can be used for frequency shifting keying (FSK) and differential phase shift keying (DPSK) demodulation in direct conversion receivers (DCRs).

12 Claims, 6 Drawing Sheets

—PRIOR ART—

APPARATUS AND METHOD FOR BASEBAND DETECTION

TECHNICAL FIELD OF THE INVENTION

The present invention relates generally to radio communication systems, and in particular, to baseband detection in such systems.

BACKGROUND OF THE INVENTION

In some radio communication systems, constant-envelop modulation schemes, such as frequency shift keying (FSK), are suitable for low-power wireless communications. At receivers within such systems, non-coherent demodulation can be used to reduce hardware complexity. In addition, direct-conversion receivers (DCRs) are also desirable for portable communications applications where low power is a requirement. A DCR translates a received radio frequency (RF) signal directly into a baseband signal without the need for image-rejection filters and other intermediate frequency (IF) components. However, conventional IF FSK detectors, such as a limiter-discriminator are not well suited for use in DCRs. Therefore, there is a need for an efficient baseband FSK detector for use with DCRs.

Figure 1:
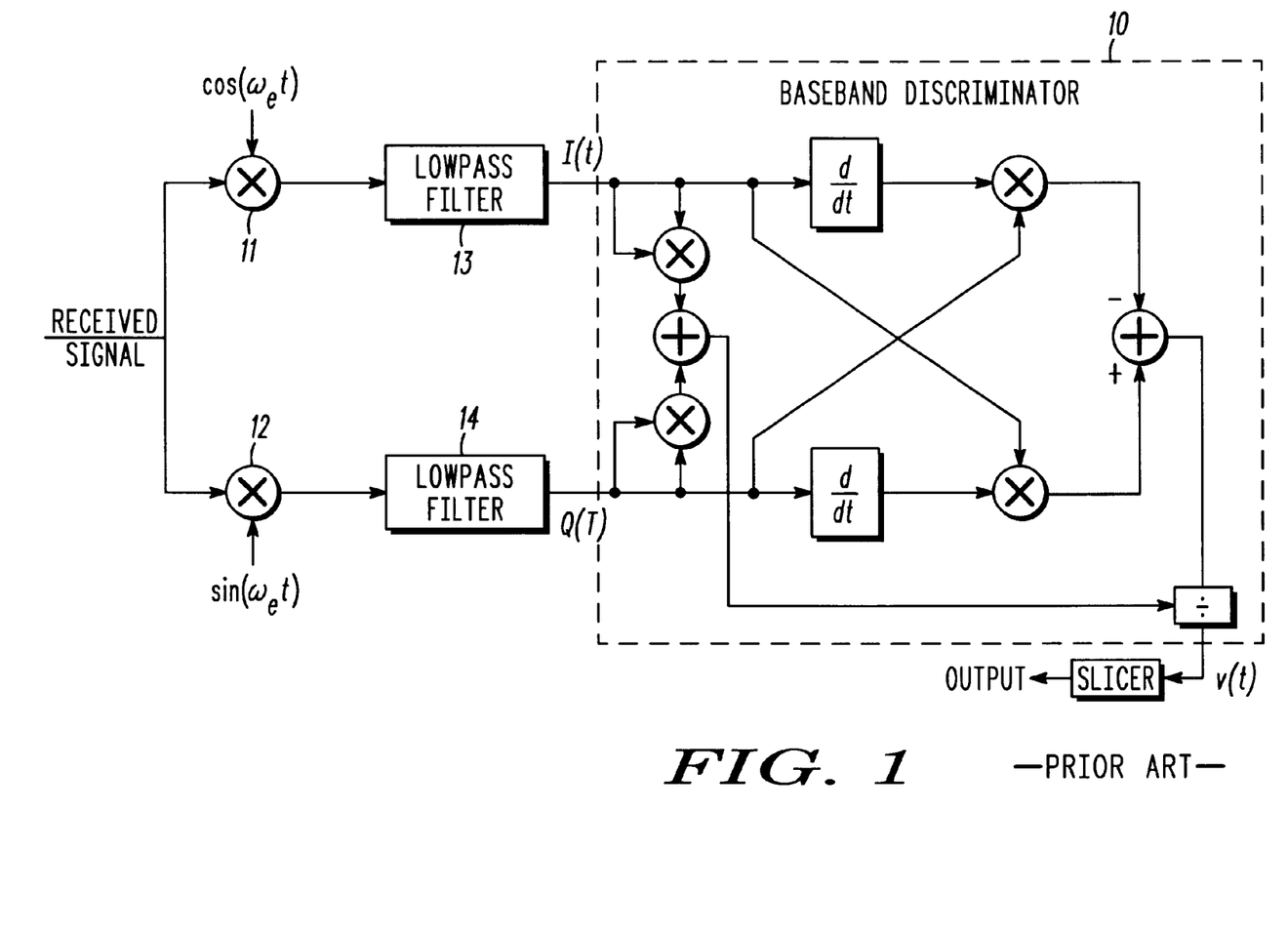
FIG. 1 is a block diagram of a prior art baseband discriminator.

Some conventional baseband discriminators can be used with DCRs. FIG. 1 shows an exemplary prior art baseband discriminator 10 usable with DCRs. The baseband discriminator 10 output is given by:

$$v(t) = \frac{I(t)\frac{dQ(t)}{dt} - Q(t)\frac{dI(t)}{dt}}{I^2(t) + Q^2(t)}, \quad (1)$$

where $I(t)=A\cos(\phi(t))$ and $Q(t)=A\sin(\phi(t))$ are, respectively, the in-phase (I) and quadrature-phase (Q) components of the baseband equivalent received signal, A is the received signal amplitude, and $\phi(t)$ is the phase function of the FSK signal. The output $v(t)$ is equal to the instantaneous frequency deviation $$\frac{d\phi(t)}{dt}.$$

A pair of mixers 11–12 and a pair of lowpass filters 13–14 provide the I and Q components to the discriminator 10.

Figure 2:
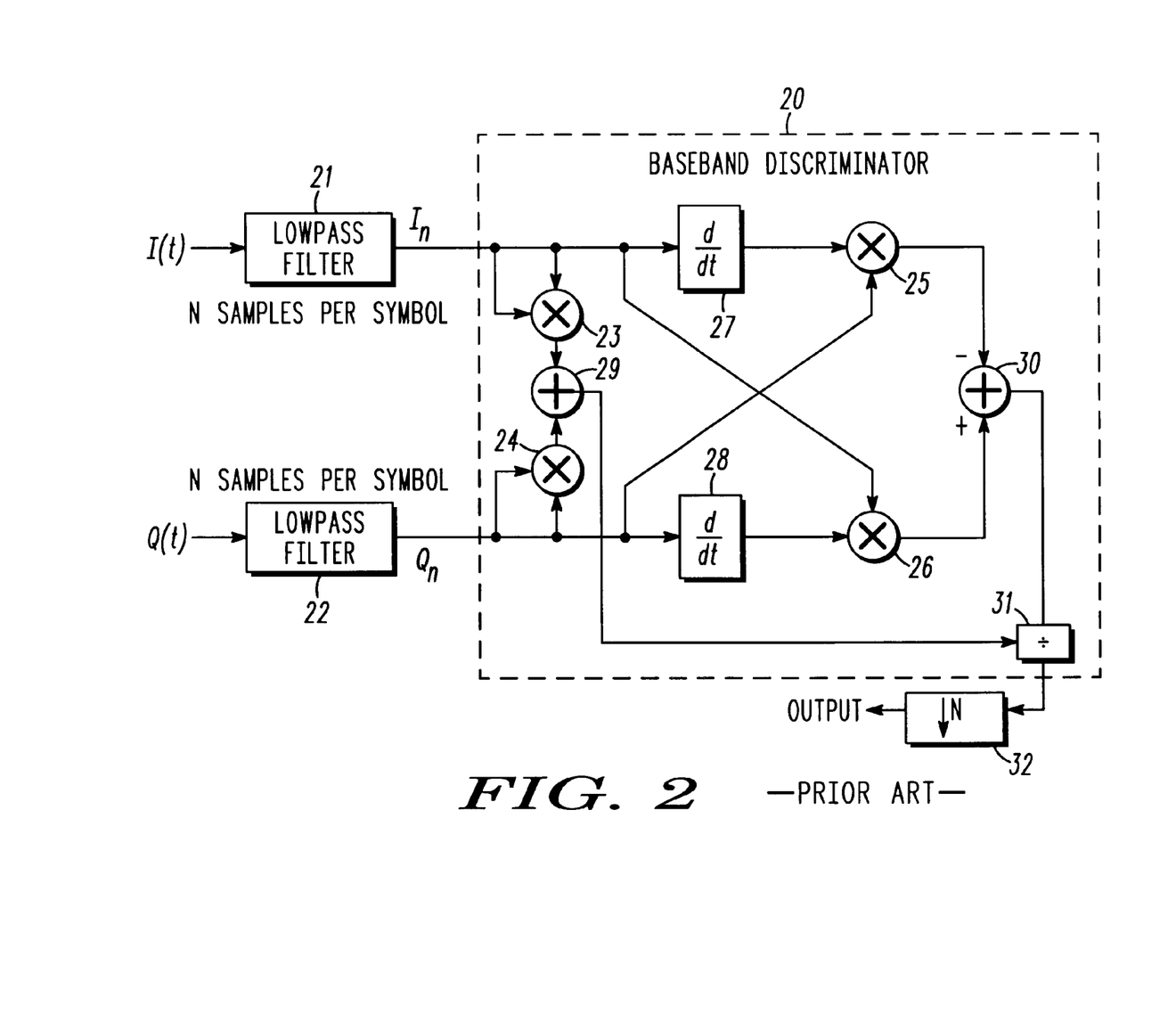
FIG. 2 is a block diagram of a digital implementation of the prior art baseband discriminator shown in FIG. 1.

The baseband discriminator 10 shown in FIG. 1 can be implemented digitally using the circuit 20 shown in FIG. 2. In this implementation, I(t) and Q(t) are sampled N times per symbol period and digitized by the analog-to-digital converters (ADCs) 21–22. The discriminator 20 includes multipliers 23–26, delay circuits 27–28, an adder 29, a subtractor 30, and a divider 31. A down sampling circuit 32 down samples or decimates the output of the divider 31.

The derivatives in FIG. 1 are approximated by the difference between samples that are $$\frac{T}{N}$$

apart in time, where T is the symbol period. The output of the digital baseband discriminator 20 is given by:

$$v_n = \frac{Q(nT)I\left(nT - \frac{T}{N}\right) - I(nT)Q\left(nT - \frac{T}{N}\right)}{I^2(nT) + Q^2(nT)}, \quad n = 0, 1, \ldots \quad (2)$$

The circuit 20 is similar to a delay-and-multiply detector (quadrature detector) in a heterodyne FSK receiver. It is also similar to a differential phase detector because $v_n$ is proportional to $$\sin\left(\phi(nT) - \phi\left(nT - \frac{T}{N}\right)\right),$$

thus when $$\frac{T}{N}$$

is small, $v_n$ is approximately proportional to the phase difference $$\phi(nT) - \phi\left(nT - \frac{T}{N}\right).$$

In general, it is desirable to keep the number of samples per sample period N small. However, when the baseband equivalent received signal is fast varying, using a small value for N incurs a significant performance loss with respect to the continuous-time implementation because the finite difference cannot accurately approximate the derivatives. This problem arises when there is a significant amount of frequency offset between the receiver and transmitter oscillators within a communication system, or when a large frequency deviation (high modulation index) is used for FSK modulation.

To overcome this accuracy problem, the number of samples per sample period N can be increased. However, while the finite differences can accurately approximate the derivatives when N is large, high-resolution analog-to-digital converters (ADCs) may be necessary because the signal variations represented by $$\left|I(nT) - I\left(nT - \frac{T}{N}\right)\right| \text{ and } \left|Q(nT) - Q\left(nT - \frac{T}{N}\right)\right|$$

decrease as N increases. This is especially true for narrow-band signals, such as FSK signals with small frequency deviations (low modulation indexes). Therefore, when used as the baseband detector for FSK, the digital baseband discriminator of FIG. 2 is very sensitive to frequency offset and frequency deviation.

Figure 3:
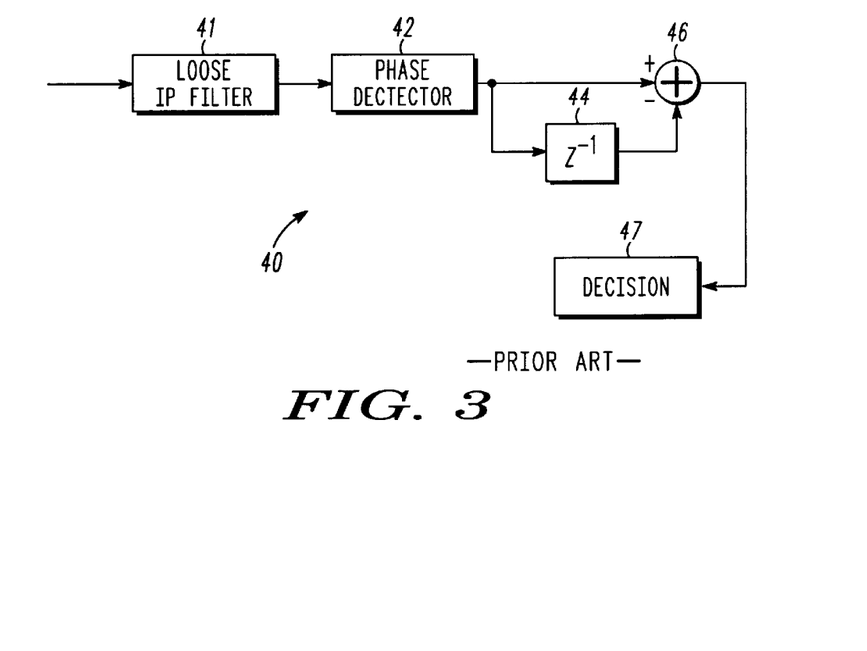
FIG. 3 is a block diagram of a prior art differential-phase baseband detector.

Another known baseband detector 40 is shown in FIG. 3. In this circuit, a time-domain received signal is filtered by an IF filter 41 and then converted to the phase-domain using a phase detector 42. The differential phase is then computed by the delay 44 and subtractor 46 for detecting the information symbol using decision circuitry 47. The merit of this circuit is that the same architecture can be used to detect FSK and differential phase shift keying (DPSK) signals. However, the input to this circuit is an IF signal, which requires IF circuit components. Thus, depending on the implementation of the phase detector 42, this architecture is not always suitable for use with DCRs. Furthermore, the mod $2\pi$ ambiguity normally associated with the phase detector 42 makes the circuit 40 sensitive to frequency offset, thus requiring a higher receiver sampling rate.

DETAILED DESCRIPTION OF THE PRESENTLY PREFERRED EMBODIMENT(S)

The present invention provides a solution to the above-mentioned problems. By using a more generalized differential detector, significant performance improvement can be obtained. The baseband detector disclosed herein is more robust against frequency offset and frequency deviation than known detectors. It does not use a phase detector, thus eliminating the mod $2\pi$ ambiguity. Furthermore, it also has the capability of detecting both FSK and DPSK signals using the same architecture.

Figure 4:
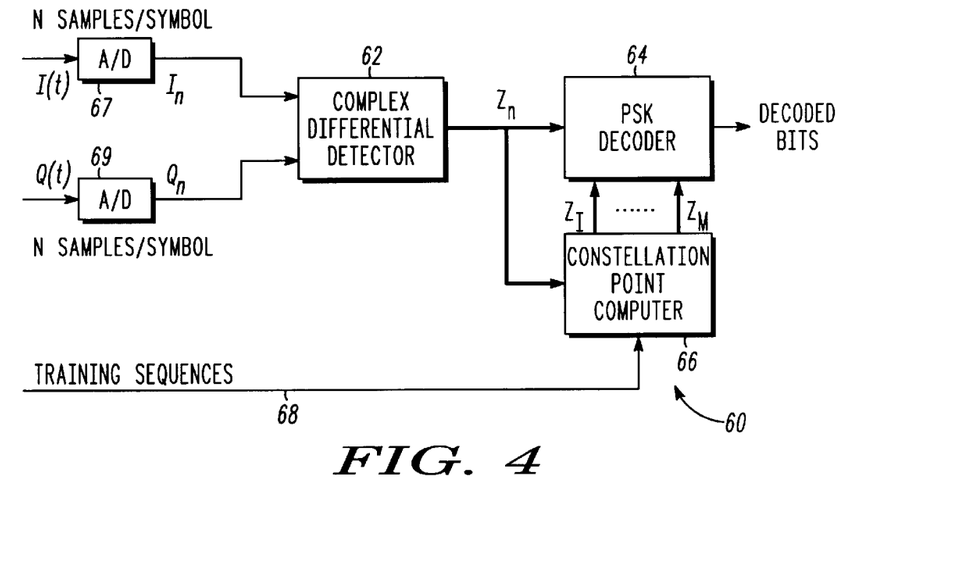
FIG. 4 is a block diagram of an exemplary baseband detector in accordance with an embodiment of the present invention.

Turning now to the drawings, and in particular to FIG. 4, there is illustrated a block diagram of a baseband detector 60 in accordance with an embodiment of the present invention. The detector 60 can be used for four-level full-response continuous-phase FSK (4-CPFSK); four-level full-response minimum phase-shift keying (4-MSK); four-level Gaussian-filtered MSK (4-GMSK); and 4-CPFSK with frequency offset.

The detector 60 includes a complex differential detector 62, PSK decoder 64, and constellation point computer 66. A pair of analog-to-digital (A/D) converters (ADCS) 67, 69 provide digitized I and Q samples to the detector 60. The ADCs 67, 69 can be 6-bit ADCs.

The complex differential detector 62 essentially maps received baseband signal samples onto a signal constellation whose elements are essentially distributed on a circle in the complex plane. A training sequence 68 is provided so that the constellation points are determined by the constellation point computer 66. The PSK decoder 64 can decode the information symbols carried by the baseband signal using the minimum Euclidean distance detection rule. In the PSK decoder 64, both the real and imaginary parts of the complex differential detector output are used for minimum-distance detection. This greatly improves the bit-error rate (BER) performance of the baseband detector 60.

Figure 5:
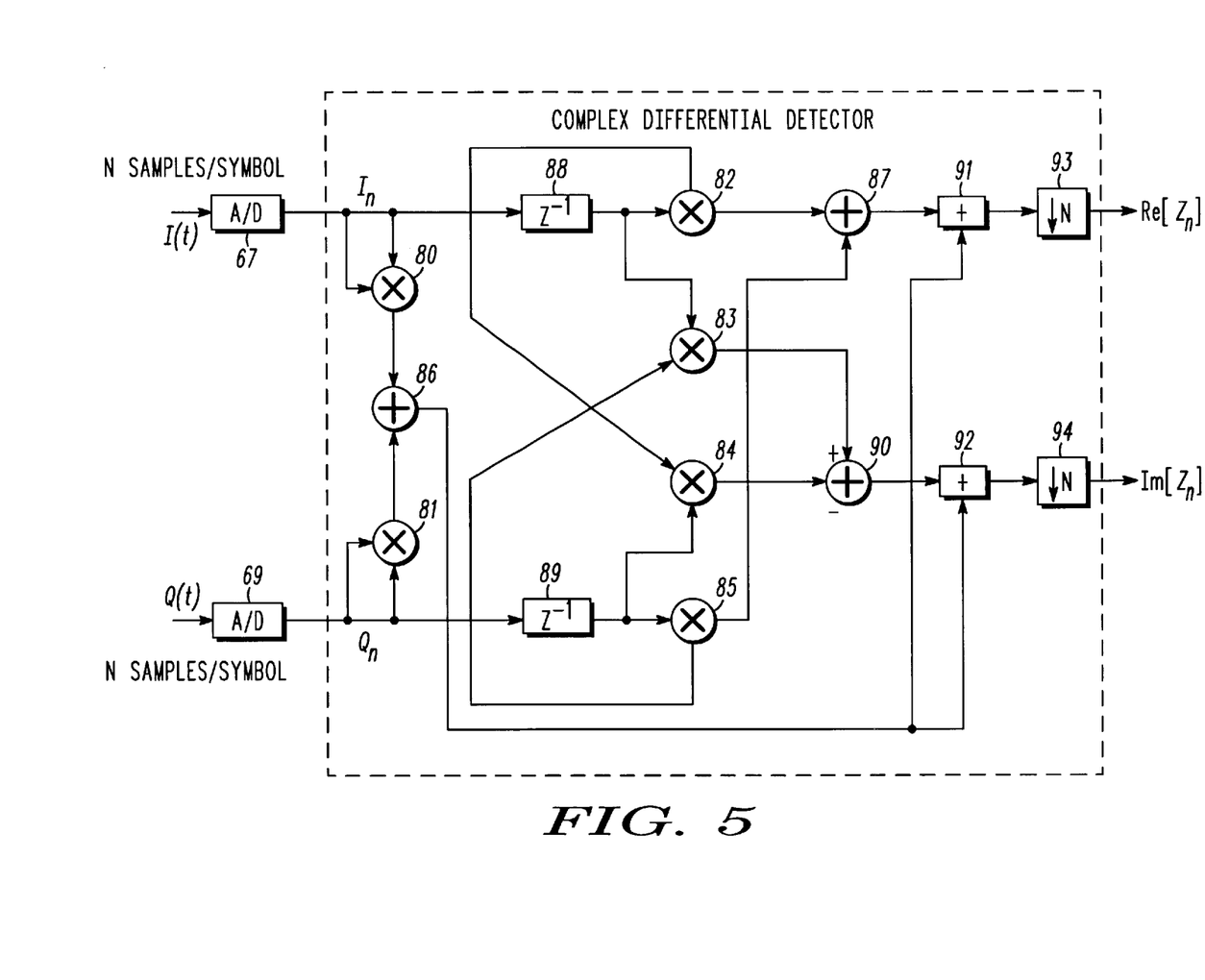
FIG. 5 is a detailed block diagram of the complex differential decoder shown in FIG. 4.

A detailed block diagram of the complex differential detector 62 is shown in FIG. 5. The inputs to the complex differential detector 62 are samples of I(t) and Q(t) taken at N samples per symbol period. These samples can be conveniently represented in complex notations by $$y\left(\frac{nT}{N}\right) = I\left(\frac{nT}{N}\right) + jQ\left(\frac{nT}{N}\right).$$

Similarly, the output of the complex differential detector 62 can be complex values represented in complex notations by:

$$z_n = \frac{y(nT)y^*\left(nT - \frac{T}{N}\right)}{|y(nT)|^2} \quad (3)$$

$$= \frac{\left[I(nT)I\left(nT - \frac{T}{N}\right) + Q(nT)Q\left(nT - \frac{T}{N}\right)\right] + j\left[Q(nT)I\left(nT - \frac{T}{N}\right) - I(nT)Q\left(nT - \frac{T}{N}\right)\right]}{I^2(nT) + Q^2(nT)}$$

where * denotes complex conjugation. The imaginary part Im[$z_n$] of the complex value output of the complex differential detector 62 is of the same form as the output of the conventional digital baseband discriminator 20 shown in FIG. 2. The complex differential detector 62 with N=1 (one sample per symbol) can be used for baseband detection of DPSK signals. For FSK demodulation, the complex differential detector 62 uses N=2, together with some low-complexity digital signal processing.

The sampling rate for the complex differential detector 62 can be fixed at two samples per symbol (N=2). With increases in modulation index, the received signal varies faster and a sampling rate of two samples per symbol may not be entirely adequate for baseband discrimination. In such circumstances, four samples per symbol period can be used to improve the performance of the complex differential detector 62.

The complex differential decoder 62 can include a plurality of multipliers 80–85, adders 86–87, delay circuits 88–89, a subtractor 90, dividers 91–92, and down sampling circuits 93–94.

Figure 6:
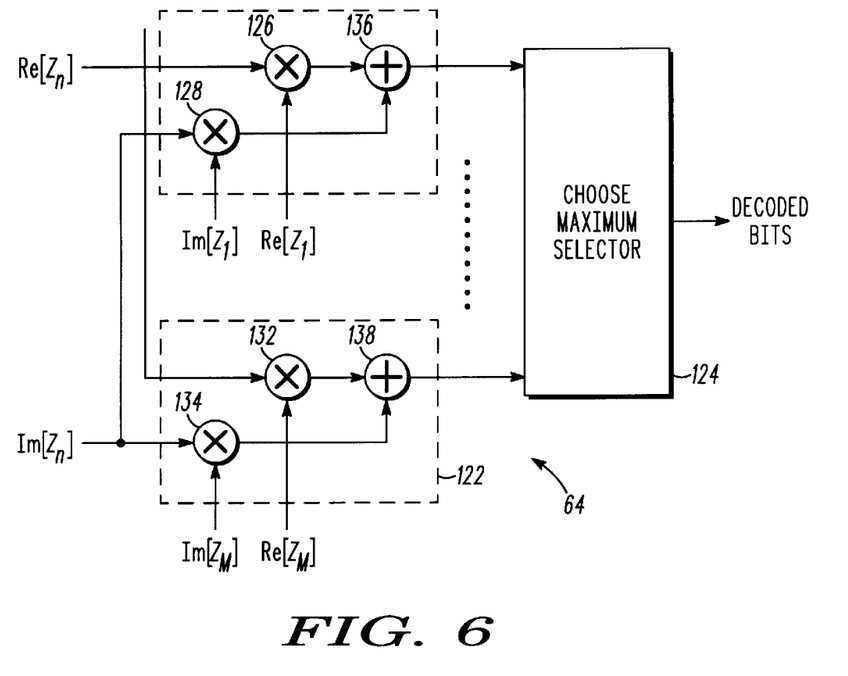
FIG. 6 is a detailed block diagram of the phase-shift keying (PSK) decoder shown in FIG. 4.

FIG. 6 is a detailed block diagram of the PSK decoder 64 shown in FIG. 4. The PSK decoder 64 takes the output of the complex differential detector 62 and uses the minimum Euclidean distance rule to generate the decoded bits representing the information symbols carried by the received baseband signal. Since each of the constellation points $Z_m$ has the same magnitude, minimizing the Euclidean distance between $z_n$ and $Z_m$ is equivalent to maximizing their inner product. Therefore, the PSK decoder 64 computes the inner products Re[$z_n Z_m^*$], m=1,2, ... M, where M is the level of modulation, and outputs the information symbols corresponding to the largest inner products.

The PSK decoder 64 can include a plurality of inner product circuits 120–122 and a selector circuit 124 for selecting the largest inner product. Although only two inner product circuits are illustrated, more than two inner product circuits can be included.

The PSK decoder 64 computes an inner product for each level of modulation 14. Thus, for a four-level modulation scheme, four inner products are computed. In one embodiment of the invention, four inner product circuits are included in the PSK decoder 64 to support the four-level modulation. In an alternative embodiment of the four-level scheme, less than four inner product circuits are employed, with at least one of the circuits being shared in time-multiplexed manner to perform multiple inner product computations per input symbol.

In the example shown, each inner product circuit includes a first multiplier 126, 132 for multiplying real components, a second multiplier 128, 134 for multiplying imaginary components, and an adder 136, 138 for summing the products output by the multipliers 126–134, respectively as shown.

Figure 7:
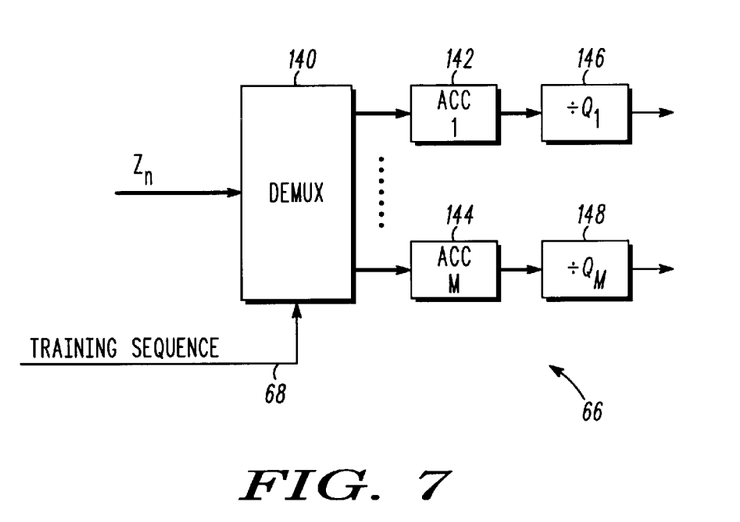
FIG. 7 is a detailed block diagram of the constellation point computer shown in FIG. 4.

A detailed block diagram of the constellation point computer 66 is shown in FIG. 7. The computer 66 adaptively computes the constellation points $Z_1 \ldots Z_M$ from a predetermined training sequence 68. The training sequence 68 allows the acquisition of the constellation points. The training sequence consists of $Q_m$ instances of the information symbol m, for m=1, 2, . . . , M. The total length of the training sequence is therefore $$\sum_{m=1}^{M} Q_m.$$

For each information symbol, the constellation point $Z_m$ can be the arithmetic average of the corresponding complex value outputs of the complex differential detector 62.

To accomplish the above functions, the constellation point computer 66 includes a de-multiplexer (DEMUX) 140, a plurality of accumulators 142–144, and a corresponding plurality of dividers 146–148. In a training mode, the detector 60 receives a predesignated sequence of inputs representing known information symbols. These inputs are converted to complex values $z_n$ by the complex differential detector 62. These complex values are then provided as training input to the constellation point computer 66. The training sequence input 68 is applied to the DEMUX 140 to select an accumulator and divider corresponding to the particular information symbol. At the end of the training sequence, the output of the dividers 146–148 represent the constellation points $Z_1 \ldots Z_M$.

The constellation points $Z_M$ can be computed using techniques other than arithmetic averaging. For example, the constellation point computer 66 can be configured to compute the constellation points as a function of the median values of the complex outputs generated by the complex differential decoder 62 in response to the training sequence input. Alternatively, the computer 66 can use other statistical processing schemes, such as throwing out outlyers above a pre-establish threshold deviation and computing an arithmatic average for $Z_M$ based on the remaining complex values falling within the threshold range.

The training mode of the detector 60 can be entered into based on channel and receiver characteristics to adaptively update the constellation points. This ability to adaptively update constellation points improves the overall performance of the detector 60.

In an alternative embodiment, the training sequence may be replaced by using "differential" modulation, or by using blind algorithms for the constellation point computer.

The circuits illustrated in FIGS. 4–7 are shown as exemplary architectures, and the present invention is not limited to the specific implementations shown. Further, the circuits of FIGS. 4–7 can be implemented using various combinations of hardware and software components. For example, the circuits can be implemented using one or more microprocessors or digital signal processors (DSPs) configured by a software program to perform the functions disclosed herein. Alternatively, the circuits can be built using one or more application specific integrated circuits (ASICs).

Figure 8:
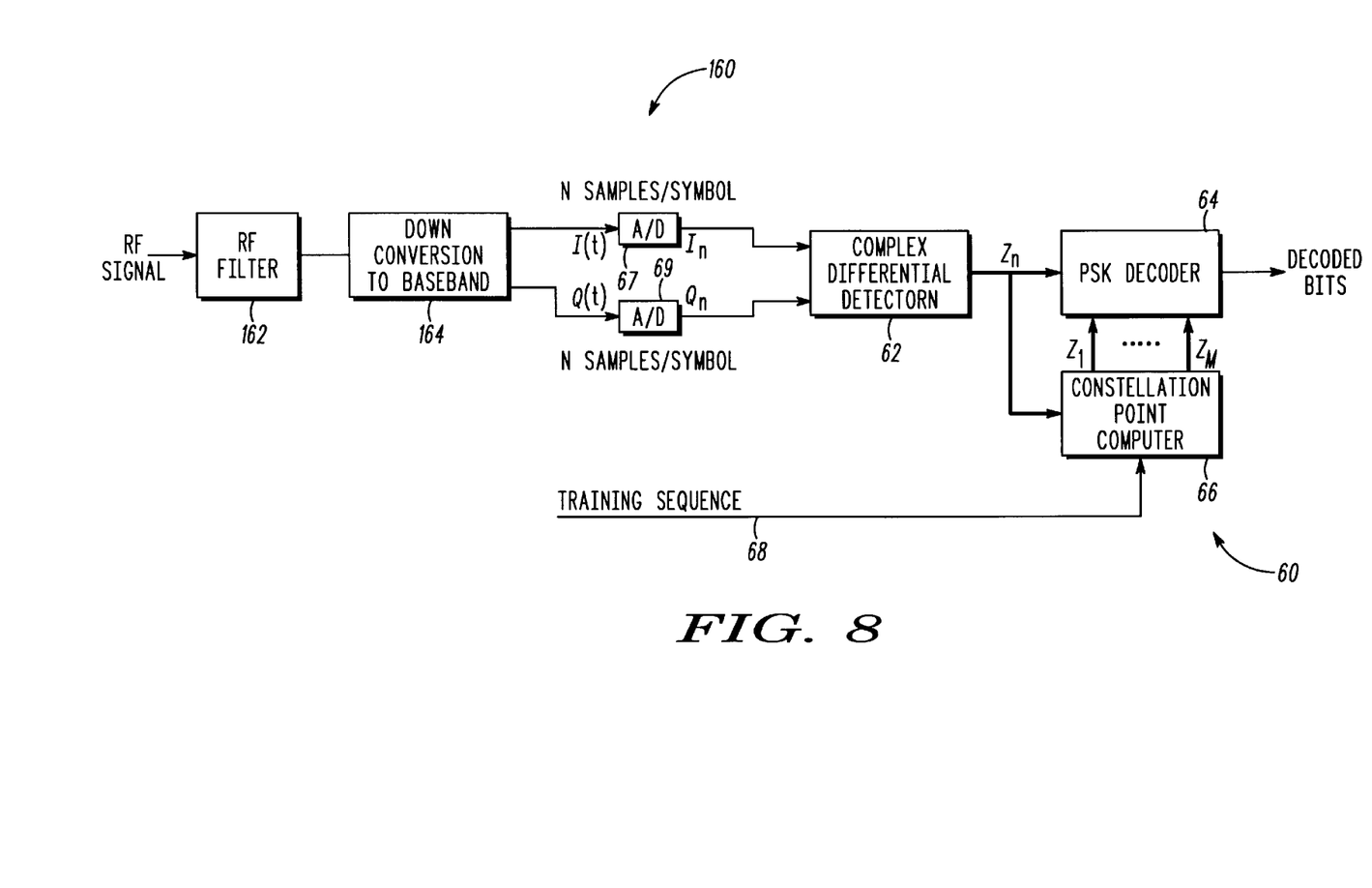
FIG. 8 is a block diagram of a receiver incorporating the baseband detector of FIG. 4 in accordance with another embodiment of the invention.

FIG. 8 is a block diagram of a receiver 160 that incorporates the baseband detector 60 of FIG. 4 in accordance with another embodiment of the invention. In addition to the baseband detector 60, the receiver 160 includes a radio frequency (RF) filter 162 and a down conversion circuit 164.

The RF filter 162 and down conversion circuit 164 can be implemented using commercially-available components. The receiver 160 can be a DCR.

One advantage of the present invention is that it provides a detector that exhibits superior performance when measured against normalized frequency offset. The normalized frequency offset is the frequency offset normalized by the symbol rate. The performance of the detector 60 is independent of the, while the performance of the conventional digital baseband discriminator shown in FIG. 2 is sensitive to normalized frequency offset.

Moreover, if the baseband received signal envelope fluctuations are small compared to the signal level, then the normalization of Eq. (3) is unnecessary.

The detector 60 can be modified for binary FSK. This can be accomplished by further quantizing the signals $I_n$ and $Q_n$ (but not $I_{n-1}$ and $Q_{n-1}$) in FIG. 5 using one-bit ADCs. This could eliminate the need for the multipliers.

While specific embodiments of the present invention have been shown and described, it will be apparent to those skilled in the art that the disclosed invention may be modified in numerous ways and may assume many embodiments other than those specifically set out and described above. Accordingly, the scope of the invention is indicated in the appended claims, and all changes that come within the meaning and range of equivalents are intended to be embraced therein.

We claim:

1. An apparatus, comprising:
   a complex differential detector outputting a plurality of complex values in response to a plurality of samples derived from a baseband signal;
   a constellation point computer outputting a plurality of constellation points based on a training sequence;
   a phase shift keying (PSK) decoder outputting a plurality of decoded bits in response to the complex values and the constellation points;
   wherein the PSK decoder includes:
   a plurality of inner product circuits generating a plurality of inner products in response to the complex values and the constellation points; and
   a selector for generating the decoded bits by selecting a largest inner product from the plurality of inner products.

2. The apparatus of claim 1, further comprising:
   an analog to digital converter (ADC) for generating the samples in response to an in-phase component of the baseband signal.

3. The apparatus of claim 1, further comprising:
   an analog to digital converter (ADC) for generating the samples in response to a quadrature-phase component of the baseband signal.

4. The apparatus of claim 1, wherein the complex differential detector includes:
   a first multiplier outputting a squared in-phase (I) component in response to an input I component;
   a second multiplier outputting a squared quadrature-phase (Q) component in response to an input Q component;
   a first adder for producing a first sum in response to the squared I and squared Q components;
   a first delay circuit outputting a delayed I component in response to the input I component;
   a second delay circuit outputting a delayed Q component in response to the input Q component;
   a third multiplier outputting a third multiplier output in response to the delayed I component and the input I component;

a fourth multiplier outputting a fourth multiplier output in response to the delayed I component and the input Q component;

a fifth multiplier outputting a fifth multiplier output in response to the input I component and the delayed Q component;

a sixth multiplier outputting a sixth multiplier output in response to the Q input component and the delayed Q component;

a second adder outputting a second sum in response to the third multiplier output and the sixth multiplier output;

a subtractor outputting a difference in response to the fourth multiplier output and the fifth multiplier output;

a first divider outputting a real value, includable in the complex values, in response to the second sum and the first sum; and a second divider outputting an imaginary value, includable in the complex values, in response to the difference and the first sum.

5. The apparatus of claim 4, further comprising:

a first down sampling circuit for down sampling the real value; and a second down sampling circuit for down sampling the imaginary value.

6. The apparatus of claim 1, wherein the PSK decoder determines the minimum distance between the complex values and the constellation points to generate the decoded bits.

7. The apparatus of claim 1, wherein at least one of the inner product circuits includes:

a first multiplier outputting a real product in response to a real component of an input complex value and a real component of a constellation point;

a second multiplier outputting an imaginary product in response to an imaginary component of the input complex value and an imaginary component of the constellation point; and an adder outputting an inner product in response to the real and imaginary products.

8. The apparatus of claim 1, wherein the constellation point computer determines each of the constellation points by computing the arithmetic average of complex values output by the complex differential detector corresponding to a predetermined information symbol.

9. The apparatus of claim 1, wherein the constellation point computer adaptively configures the constellation points.

10. The apparatus of claim 9, wherein the constellation point computer adaptively configures the constellation points based on characteristics selected from characteristics of a radio frequency channel and characteristics of a receiver.

11. The apparatus of claim 1, wherein the constellation point computer includes:

a plurality of accumulators corresponding to the plurality of constellation points;

a de-multiplexer for selectively outputting the complex values to the accumulators based on a training sequence of information symbols; and a plurality of dividers, each corresponding to one of the accumulators, for generating the constellation points by dividing the accumulator outputs by corresponding values representing information symbols.

12. The apparatus of claim 1, further comprising:

means for permitting the detection of binary frequency shift keying (FSK) signals.

* * * * *